United States Patent [19]

Kanamori

[11] Patent Number: 5,641,977
[45] Date of Patent: Jun. 24, 1997

[54] COMPOUND SEMICONDUCTOR FIELD EFFECT TRANSISTOR

[75] Inventor: Mikio Kanamori, Tokyo, Japan

[73] Assignee: NEC Corporation, Japan

[21] Appl. No.: 535,941

[22] Filed: Sep. 28, 1995

[30] Foreign Application Priority Data

Sep. 29, 1994 [JP] Japan .................... 6-259092

[51] Int. Cl.[6] .................... H01L 31/0328; H01L 31/0336
[52] U.S. Cl. .................... 257/192; 257/194
[58] Field of Search .................... 257/192, 194, 257/280

[56] References Cited

U.S. PATENT DOCUMENTS 5,140,386   8/1992   Hwang et al. .................... 257/194

FOREIGN PATENT DOCUMENTS 4-159730   6/1992   Japan .................... 257/194
4-280640   10/1992   Japan .

OTHER PUBLICATIONS

T. Furutsuka, et al., "Improvement of the Drain Breakdown Voltage of GaAs Power MESFET's by a Simple Recess Structure", IEEE Transactions on Electron Devices, vol. ED-25, No. 6, Jun. 1978, pp. 563-567.

Primary Examiner—Wael Fahmy

[57] ABSTRACT

On a semi-insulative GaAs substrate, a n-type GaAs layer, an undoped InGaAs layer, a $n^+$-type GaAs layer are grown in order and a $SiO_2$ layer is deposited thereon. Subsequently, a photoresist layer having an opening at a gate region is formed. With taking the photoresist layer as a mask, side etching is performed for the $SiO_2$ layer up to the width corresponding to a recess width. With taking $SiO_2$ layer as a mask, wet etching is performed for $n^+$-type GaAs layer. The wet etching is further extended to the intermediate depth position of the undoped InGaAs layer. By lift off method employing the photoresist layer, a gate electrode is formed on the center of the bottom of the recess. A source electrode and a drain electrode are also formed. Thus, since the corner portions of the recess is formed of a material (InGaAs) difficult to cause dislocation, the compound semiconductor field effect transistor can prevent degradation of characteristics in high temperature burn-in test.

6 Claims, 5 Drawing Sheets

COMPOUND SEMICONDUCTOR FIELD EFFECT TRANSISTOR

BACKGROUND OF THE INVENTION

1. Field of the Invention

The present invention relates generally to a compound semiconductor field effect transistor. More specifically, the invention relates to a compound semiconductor field effect transistor having a gate electrode formed in a recess portion.

2. Description of the Related Art

A compound semiconductor, typically GaAs, is characterized in higher electron mobility and lower noise in comparison with Si. Therefore, in the application for performing high speed and high frequency amplification with low noise, transistors employing the compound semiconductor have been frequently used. In such case, it is typical to use the compound semiconductor as MESFETs having Schottky gates for effectively utilizing high mobility property thereof. On the other hand, in case of a transistor for large output, a recess structure is employed for elevating a breakdown voltage by reducing concentration of electric field to a drain of the gate without increasing source resistance Rs.

FIG. 1 is a section showing the conventional GaAs field effect transistor (MESFET) for large output having a recess structure (hereinafter, this prior art will be referred to as "first prior art"). In FIG. 1, 1 denotes a semi-insulative GaAs substrate formed with an undoped GaAs buffer layer (not shown) on the surface. On the substrate, an n-type GaAs layer 2 serving as channel layer is formed. On the surface of the n-type GaAs layer 2, an $n^+$ type GaAs layer 4 is formed for ohmic contact with a source/drain electrode. In the $n^+$-type GaAs layer 4 and the n-type GaAs layer 2, a recess portion 20 is formed by removing the entire depth of the $n^+$-type GaAs layer 4 and in the partial depth of the n-type GaAs layer 2 by etching, in a width greater than a predetermined gate region. At the center of the recess portion 20, a gate electrode 7 in Schottky contact with the n-type GaAs layer 2 is formed. On the other hand, on the $n^+$-type GaAs layer 4, a source electrode 8 and a drain electrode 9 are formed.

It should be noted that this type of the power MESFET has been known in IEEE Transactions on Electron Devices, Vol ED-25, No. 6, pp 563–567, "Improvement of the Drain Breakdown Voltage of GaAs Power MESFET's by a Simple Recess Structure", for example.

This first prior art has a problem in that a transistor characteristic may be degraded by applying a power at high temperature. FIG. 2 is a graph showing variation of a drain current when the transistor of FIG. 1 is formed to have a gate length of 1 μm and a gate width of 5 mm, and 12 V drain voltage is applied with maintaining a temperature at 250° C., as high temperature burn-in test. As can be seen a drain current is gradually lowered after about 500 hours. This degradation of the characteristics is considered to be caused by occurrence of crystal dislocation in the drain side end of the recess and by propagation of the dislocation due to continuing of application of power under high temperature.

After forming the shown MESFET, a protective layer is formed. Then, the MESFET is assembled in a package. Since the MESFET has different thermal expansion coefficient to the protective layer and the semiconductor crystal of the package or so forth, a stress is created within a crystal. For example, when the FET is mounted on a Cu package, since Cu has greater thermal expansion coefficient than GaAs, compression stress is exerted on the GaAs as cooled after mounting. Then, the stress resided within the crystal concentrates at the corner portion of the recess. Also, at the drain side end of the recess, concentration of the electric field is caused to concentrate the current at this portion. Therefore, when high voltage is applied to the drain as in the high temperature burn-in test, significant electric field concentration and high current concentration is caused at the drain side end of the recess to make the corresponding portion high temperature, locally. Then, by the stress as set forth above and concentration of the electric field and the current, crystal dislocation is caused at the end portion of the recess. When application of power is maintained, the defect thus caused extends to a channel region. As a result, degradation of the transistor characteristics is caused.

On the other hand, Japanese Unexamined Patent Publication (Kokai) No. Heisei 4-280640 proposes to provide a InGaAs layer serving as an etching stopper below a contact layer (hereinafter, this prior art will be referred to as "second prior art"). It should be noted that the semiconductor disclosed in the above-identified publication is not directed to a power transistor. FIG. 3 shows a section showing a structure of a transistor proposed in the above-identified publication. The shown transistor is fabricated through the following process.

On a semi-insulative GaAs substrate 11, an undoped GaAs layer 12 as a channel layer, n-type AlGaAs layer 13 as a carrier supply layer, an undoped GaAs layer 14 as a cap layer of a gate metal, InGaAs layer 15 as an etching stop layer and $n^+$-type GaAs layer 16 as a contact layer are grown in order. On the $n^+$-type GaAs layer 16, a source electrode 18 and a drain electrode 19 are formed. Thereafter, the $n^+$-type GaAs layer 16 and InGaAs layer 15 in the region where a gate electrode should be formed, are removed. Then, the removed portion, the gate electrode 17 is formed.

However, as set out later, in comparison with GaAs, InGaAs is not easily cause crystal dislocation and the propagation speed of the dislocation is low. Therefore, even when a means for forming the InGaAs layer on the upper portion of the recess is applied to the power MESFET, as disclosed in the second prior art, crystal dislocation is started from GaAs and thus, dislocation occurrence suppressing effect cannot be expected. Furthermore, since a stress at the hetero interface of GaAs/InGaAs is added, spreading of dislocation is rather promoted.

SUMMARY OF THE INVENTION

It is an object of the present invention to provide a compound semiconductor field effect transistor which has a structure difficult to cause dislocation and difficult to expand defect even when high temperature burn-in test is performed.

In a compound semiconductor field effect transistor according to the present invention, a first semiconductor layer to be a channel layer, a second semiconductor layer forming corner portions of a recess and a third semiconductor layer to be a contact layer for a source and a drain electrodes are deposited on a semi-insulative semiconductor substrate. The recess is formed through the third semiconductor layer and extends at the intermediate depth position of the second semiconductor layer. On the bottom of the recess, a gate electrode is formed. On the third semiconductor layer, the source and drain electrodes are formed. In the compound semiconductor field effect transistor according to the invention, the second semiconductor layer is formed of a material (InGaAs layer and so forth) having lower dislocation speed than the first semiconductor layer (GaAs layer and so forth).

In the alternative construction, the recess may be formed into a two level recess.

The corner portions of the recess are subjected to the greatest stress in the crystal, also subjected to concentration of electric field and current. Therefore, crystal dislocation is caused at this portion and propagate in the channel. However, since the material difficult to cause dislocation, such as InGaAs is arranged at the corner portions of the recess having the highest possibility of causing dislocation, occurrence of dislocation can be suppressed and propagation of defect can be suppressed to prevent degradation of characteristics.

As set forth above, since the field effect transistor according to the present invention forms the corner portions at the bottom of the recess of the material difficult to cause dislocation, such as InGaAs and so forth, occurrence of dislocation at the corner portion, propagation of the dislocation can be successfully suppressed. Therefore, degradation of characteristics in high temperature burn-in test can be improved.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

Next, the preferred embodiments of the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
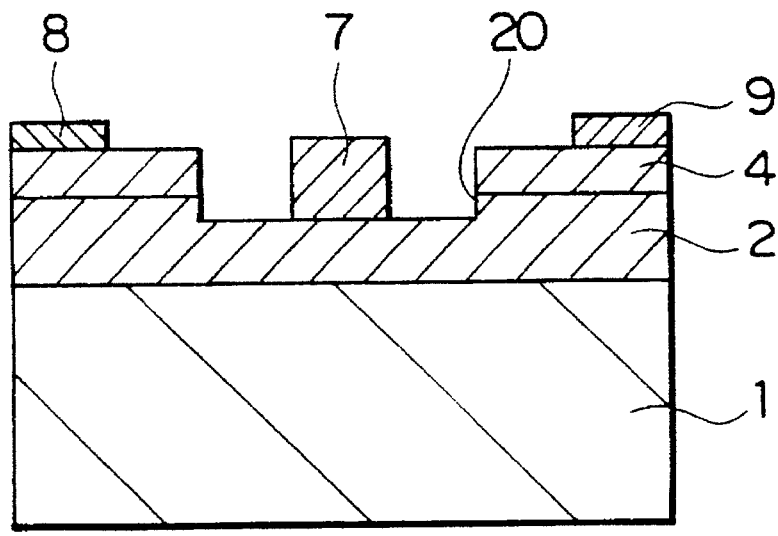
FIG. 1 is a section showing the first prior art.
Figure 2:
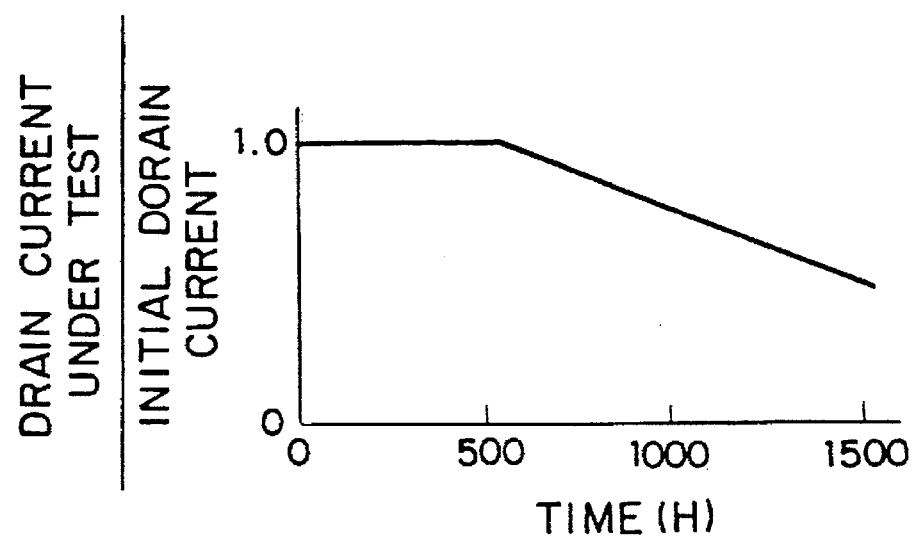
FIG. 2 is a characteristics curve chart showing a characteristic of the first prior art.
Figure 3:
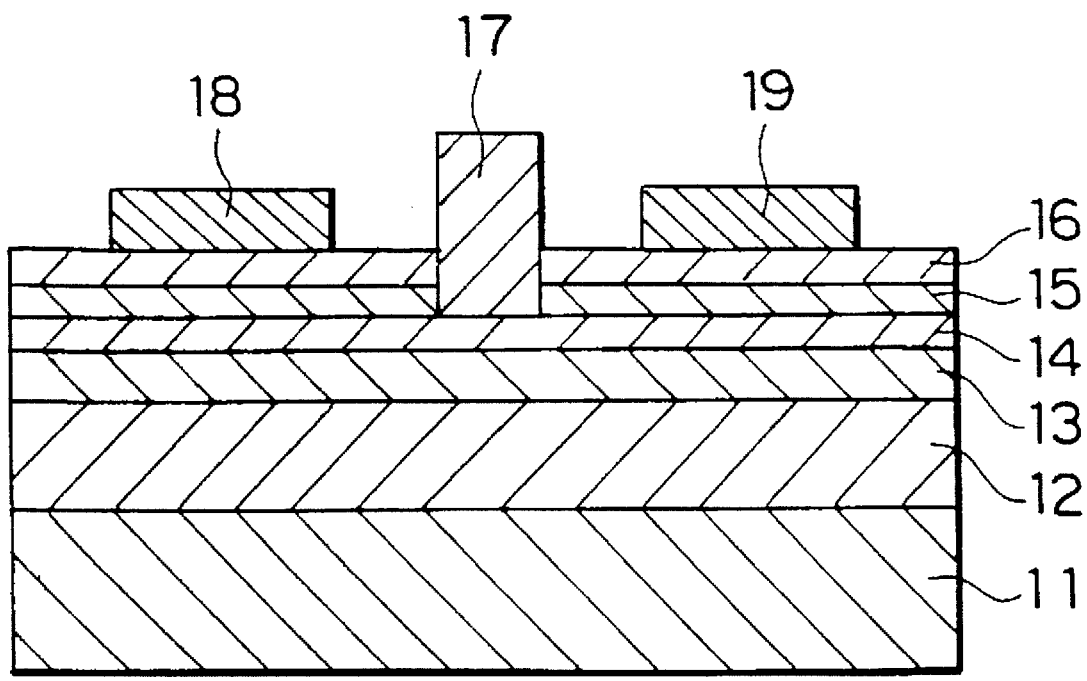
FIG. 3 is a section showing the second prior art.
Figure 4A:
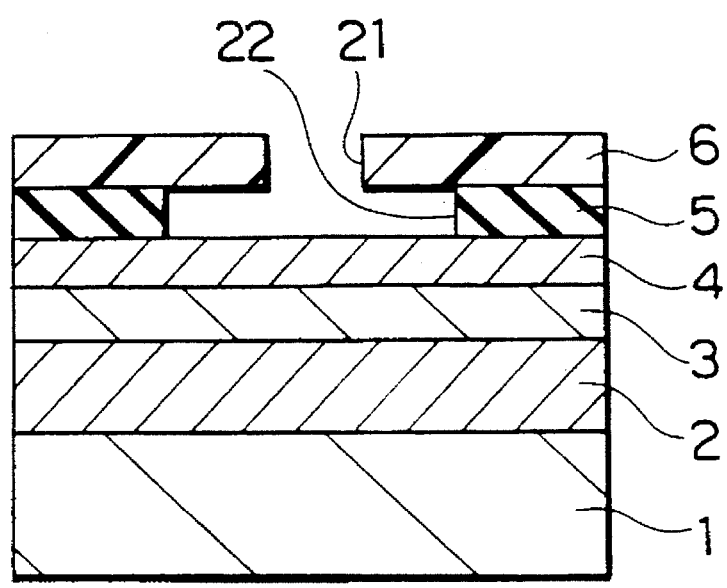
FIGS. 4A and 4B are sections in the order of fabrication process steps for explaining a fabrication process of the first embodiment of a compound semiconductor field effect transistor according to the present invention.
Figure 4B:
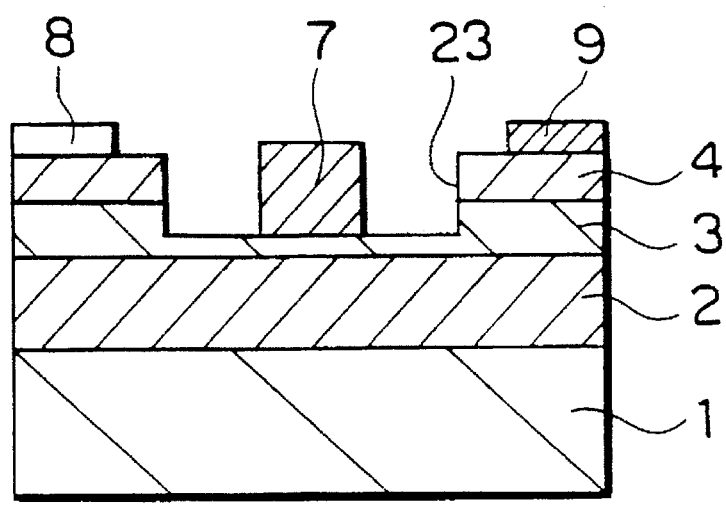

FIG. 4B is a section showing the first embodiment of the invention, and FIG. 4A is a section in an intermediate step for explaining the fabrication process thereof.

At first, as shown in FIG. 4A, a substrate 1 is fabricated by growing an undoped GaAs layer in a thickness of approximately 4000Å, as a buffer layer, by MBE (Molecular Beam Epitaxy) method on a semi-insulative GaAs substrate. On the substrate 1, n-type GaAs layer 2 in a thickness of 2000Å and having Si concentration of $1 \times 10^{17}$ cm$^{-3}$, undoped InGaAs (i-In$_{0.2}$Ga$_{0.8}$As) layer 3 in a thickness of 200 Å, n$^+$-type GaAs layer 4 in a thickness of 1000Å and having Si concentration of $3 \times 10^{17}$ cm$^{-3}$ are grown sequentially.

Next, by CVD (Chemical Vapor Deposition) method, a SiO$_2$ layer 5 in a thickness of 4000Å is deposited. Subsequently, a photoresist layer 6 having an opening 21 at a gate region is formed.

Next, with taking the photoresist layer 6 as a mask, the SiO$_2$ layer 5 is etched by diluted hydrofluoric acid. In this case, as shown in FIG. 4A, an opening 22 is formed in the SiO$_2$ layer 5 by side etching until the width becomes a recess width and in a length of 0.5 μm, for example, beyond the opening width of the photoresist layer 6.

Next, as shown in FIG. 4B, with taking the SiO$_2$ layer 5, in which the opening 22 is formed, as a mask, n$^+$-type GaAs layer 4 is etched with an etching liquid of phosphoric acid and hydrogen peroxide. After completely removing n$^+$-type GaAs layer 4 positioned within an opening 22 of the SiO$_2$ layer 5, with the same etching liquid, the undoped InGaAs layer 3 is etched in an intermediate depth, i.e. in a depth of 100Å. By this, a recess 23 is formed in the undoped InGaAs layer 3 and the n$^+$-type GaAs layer 4.

Next, vacuum deposition of Al is performed. Then, Al layer is formed on the photoresist layer 6 (FIG. 4A) and on the undoped InGaAs layer 3 at the portion positioned within the opening 21 of the photoresist layer 6. Subsequently, by removing the photoresist layer 6, the Al layer on the photoresist layer 6 is lifted off to form a gate electrode 7 consisted of the Al layer on the undoped InGaAs layer 3. The gate electrode 7 is formed at the center within the recess 23 in a width smaller than the recess 23. Finally, after removing the SiO$_2$ layer 5, AuGe-Ni layer is deposited by vacuum deposition. By patterning the AuGe-Ni layer and subsequently providing heat treatment at 400° C., the source electrode 8 and the drain electrode 9 in ohmic contact with the n$^+$-type GaAs layer 4 are formed.

In the compound semiconductor field effect transistor constructed as set forth above, since the material which is difficult to dislocate, such as InGaAs layer 3, is provided at the corner portion of the recess 23 where the dislocation is easily caused, the dislocation is prevented from propagating and defect is difficult to spread. Therefore,degradation of characteristics can be prevented.

Figure 5A:
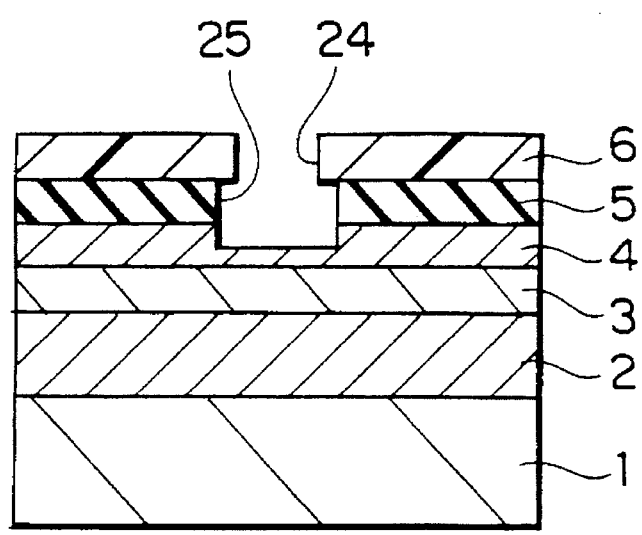
FIGS. 5A–5C are sections in the order of fabrication process steps for explaining a fabrication process of the second embodiment of a compound semiconductor field effect transistor according to the present invention.
Figure 5B:
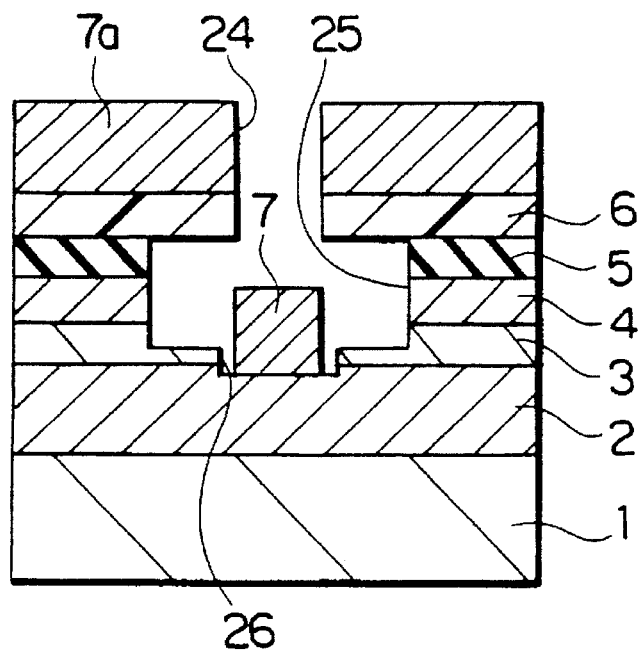
Figure 5C:
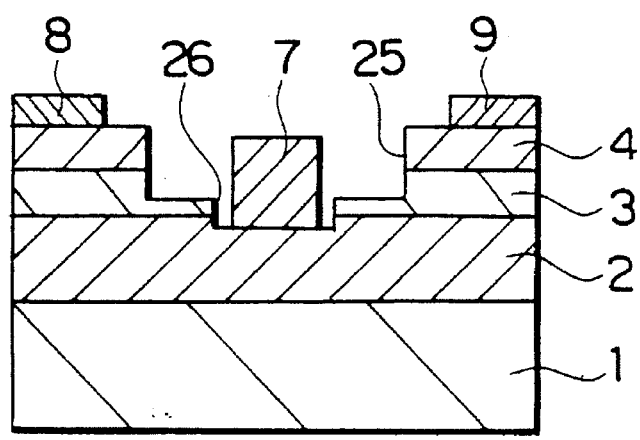

Next, the second embodiment of the present invention will be discussed with reference to FIGS. 5A to 5C. FIG. 5C is a section of the second embodiment of a compound semiconductor field effect transistor, and FIGS. 5A and 5B are sections showing intermediate steps in fabrication process for explaining the fabrication process. The transistor of the shown embodiment is a MESFET having two level recess structure. In FIGS. 5A to 5C, the like elements to those in FIGS. 4A and 4B will be represented by the same reference numerals and the detailed description therefor will be neglected for avoiding redundancy and for keeping the disclosure simple enough to facilitate understanding of the invention.

At first, as shown in FIG. 5A, on the substrate 1 which is fabricated by growing undoped GaAs layer on the semi-insulative GaAs substrate, respective semiconductor layers 2, 3 and 4 are grown by epitaxial growth. Also, on the n$^+$-type GaAs layer 4, the SiO$_2$ layer 5 is grown. The layer thickness, impurity concentration and so forth of these layers are the same as those in the first embodiment.

Subsequently, on the SiO$_2$ layer 5, the photoresist layer 6 with an opening 24 in the gate region is formed. With taking this photoresist layer 6 as a mask, the $SiO_2$ layer 5 is etched by the diluted hydrofluoric acid. In this case, as shown in FIG. 5A, the side etching of the $SiO_2$ layer 5 should be limited at approximately 0.2 μm, for example. After the side etching of the $SiO_2$ layer 5, $n^+$-type GaAs layer 4 is etched in a depth of 300Å. By this, a recess 25 is formed in the $SiO_2$ layer 5 and $n^+$-type GaAs layer 4.

Next, as shown in FIG. 5B, the side etching of the recess 25 of the $SiO_2$ layer 5 and the $n^+$-type GaAs layer 4 is expanded to 0.5 μm. Thereafter, crystal etching is again performed so that the bottom of the recess 25 (first recess) at the upper portion lies at the intermediate position in the depth direction of the undoped InGaAs layer 3. For example, the undoped InGaAs layer 3 is etched in the depth of 100 Å. At this time, at the center portion of the opening 24, etching is advanced at the portion corresponding to the width of the recess 25 formed in the $n^+$-type GaAs layer 4 in the process step of FIG. 5A. Therefore, a second recess 26 in the depth of approximately 300Å is formed at the center portion of the first recess. In the second recess 26, the undoped InGaAs layer 3 is completely removed, and the surface of the n-type GaAs layer 2 is slightly removed.

Subsequently, with taking the photoresist layer 6 as a mask, gate electrode 7 and Al layer 7a are formed on the n-type GaAs layer 2 at the center portion of the second recess 26 and on the photoresist layer 6 by vacuum deposition of the Al layer.

Thereafter, as shown in FIG. 5C, together with the photoresist layer 6, an unnecessary Al layer 7a on the photoresist layer 6 is removed. Furthermore, the $SiO_2$ layer 5 is removed. Subsequently, AuGe—Ni is deposited. After patterning the AuGe—Ni layer, heat treatment is performed at a temperature of 400° C. to form the source electrode 8 and the drain electrode 9 of ohmic contact.

In the shown embodiment, the gate electrode 7 forms Schottky junction with the GaAs layer 2 having wider band gap than the InGaAs layer 3, the gate leak voltage can be limited to be lower than that in the first prior art.

On the other hand, even in the shown embodiment, since the corner portion of the first recess 25, at which concentration of the stress and the electric field becomes highest, is formed of the InGaAs layer 3, degradation at the high temperature burn-in test can be prevented.

Since the second recess 26 is formed in a manner slightly cutting into the GaAs layer 2 for certainly form the gate electrode 7 above the GaAs layer 2, the corner portion of the second recess 26 is formed within the GaAs layer 2. Even at the corner portion of the second recess 26, there are certain magnitude of concentration of the stress. However, this portion is depleted by the voltage applied to the gate electrode, current may not flow therethrough. Accordingly, elevation of the temperature due to concentration of the current may not be caused. Therefore, degradation of the electrical characteristics will not create a problem.

Figure 6:
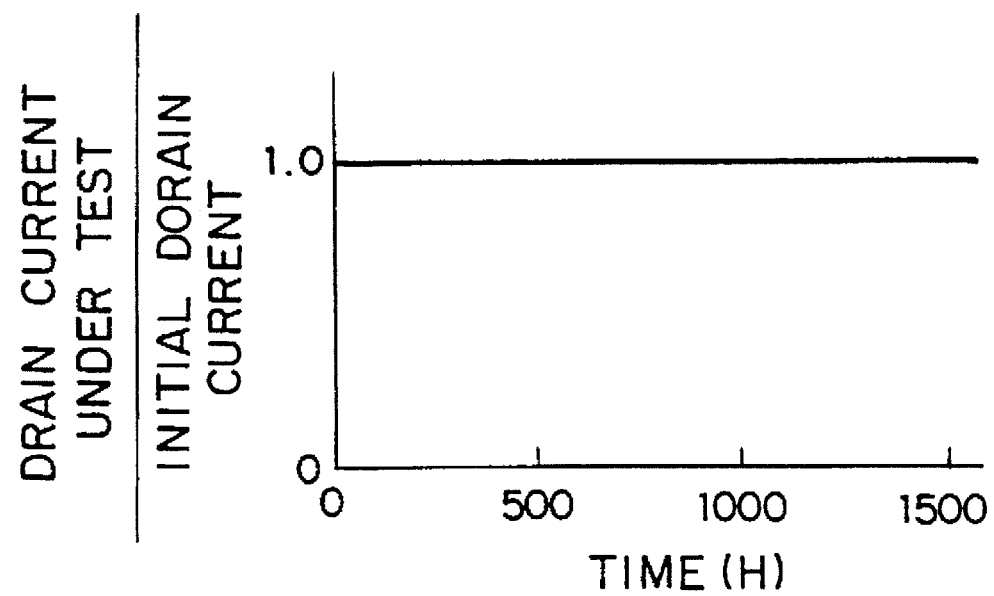
FIG. 6 is a characteristics chart for explaining the effect of the present invention.

FIG. 6 is a graph showing the result of high temperature burn-in test performed with respect to the shown embodiment of the field effect transistor. As shown in FIG. 6, when drain current is measured by forming a transistor having the gate length of 1 μm and the gate width of 5 mm and by applying a drain voltage of 12 V with maintaining the temperature of 250° C., it has been found that the drain current can be maintained at the initial value for a long period.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A compound semiconductor field effect transistor comprising:

a semi-insulative semiconductor substrate;

a first semiconductor layer on said substrate and serving as a channel layer, said first semiconductor layer is an n-type GaAs layer;

a second semiconductor layer on said first semiconductor layer and forming corner portions of a recess, said second semiconductor layer being of a material having lower dislocation propagation speed than that of said first semiconductor layer, said second semiconductor layer is undoped InGaAs layer a third semiconductor layer on said second semiconductor layer, said second and third semiconductor layers having a recess extending through said third semiconductor layer and at an intermediate position of said second semiconductor layer;

a gate electrode on the bottom surface of said recess; and source and drain electrodes on said third semiconductor layer, said third semiconductor layer forming a contact layer for said source and drain electrodes.

2. A compound semiconductor field effect transistor comprising:

a semi-insulative semiconductor substrate;

a first semiconductor layer formed on said substrate and serving as a channel layer;

a second semiconductor layer on said first semiconductor layer and forming corner portions of a recess, said second semiconductor layer being formed of a material having lower dislocation propagation speed than that of said first semiconductor layer;

a third semiconductor layer on said second semiconductor layer, said second and third semiconductor layers having a first recess with a center portion extending through said third semiconductor layer and at an intermediate position of said second semiconductor layer, and said first and second semiconductor layers having a second recess located at the center portion of said first recess and extending through a remaining portion of said second semiconductor layer and partially recessed in said first semiconductor layer;

a gate electrode on the bottom surface of said second recess; and source and drain electrodes on said third semiconductor layer, said third semiconductor layer forming a contact layer for said source and drain electrodes.

3. A compound semiconductor field effect transistor as set forth in claim 1, wherein said third semiconductor layer is $n^+$-type GaAs layer.

4. A compound semiconductor field effect transistor as set forth in claim 2, wherein said first semiconductor layer is n-type GaAs layer.

5. A compound semiconductor field effect transistor as set forth in claim 2, wherein said second semiconductor layer is an undoped InGaAs layer.

6. A compound semiconductor field effect transistor as set forth in claim 2, wherein said third semiconductor layer is $n^+$-type GaAs layer.

* * * * *